United States Patent
Burke et al.

[11] Patent Number: 5,902,495
[45] Date of Patent: May 11, 1999

[54] METHOD AND APPARATUS FOR ESTABLISHING A SOLDER BOND TO A SOLDER BALL GRID ARRAY

[75] Inventors: Edward J. Burke, Apalachin; Donald Wesley Henderson, Ithaca; Lawrence Philip Lehman, Endicott, all of N.Y.; Daniel C. Webster, deceased, late of Castle Creek, N.Y., by Corrine E. Webster, executrix

[73] Assignee: International Business Machines Corporation, Armonk, N.Y.

[21] Appl. No.: 08/734,934

[22] Filed: Oct. 22, 1996

[51] Int. Cl.$^6$ .................................................. B23K 1/00
[52] U.S. Cl. .................................... 219/85.22; 219/85.19
[58] Field of Search ............................ 219/86.41, 85.16, 219/85.18, 85.19, 110, 117.1, 85.22; 228/179.1, 180.1, 180.21, 180.22

[56] References Cited

U.S. PATENT DOCUMENTS

| | | | |
|---|---|---|---|
| 4,441,006 | 4/1984 | Machida et al. | 219/110 |
| 4,657,169 | 4/1987 | Dostoomian et al. | |
| 4,805,830 | 2/1989 | Kawaguchi | 219/85.19 |
| 5,240,165 | 8/1993 | Geyer et al. | |
| 5,317,125 | 5/1994 | Rossi | |
| 5,386,092 | 1/1995 | Dufrenne | |
| 5,587,091 | 12/1996 | Kawagoe et al. | 219/110 |
| 5,632,912 | 5/1997 | Cecil | 219/86.41 |
| 5,645,738 | 7/1997 | Cecil | 219/110 |

FOREIGN PATENT DOCUMENTS 4000945  1/1990  Germany .

*Primary Examiner*—Clifford C. Shaw
*Attorney, Agent, or Firm*—Ratner & Prestia; Lawrence R. Fraley

[57] ABSTRACT

Apparatus and method for establishing a solder bond between a solder ball grid array and a circuit mounted on a substrate includes a bonding tool having a bonding tip for applying heat to the site of one or more of the solder balls in the solder ball grid array, a transducer for measuring displacement of the bonding tip during the bonding operation, and a signal generator responsive to the transducer for providing a signal indicative of tip displacement. The signal generated by the signal generator may be fed back to the bonding tool to optimize bonding parameters.

13 Claims, 6 Drawing Sheets

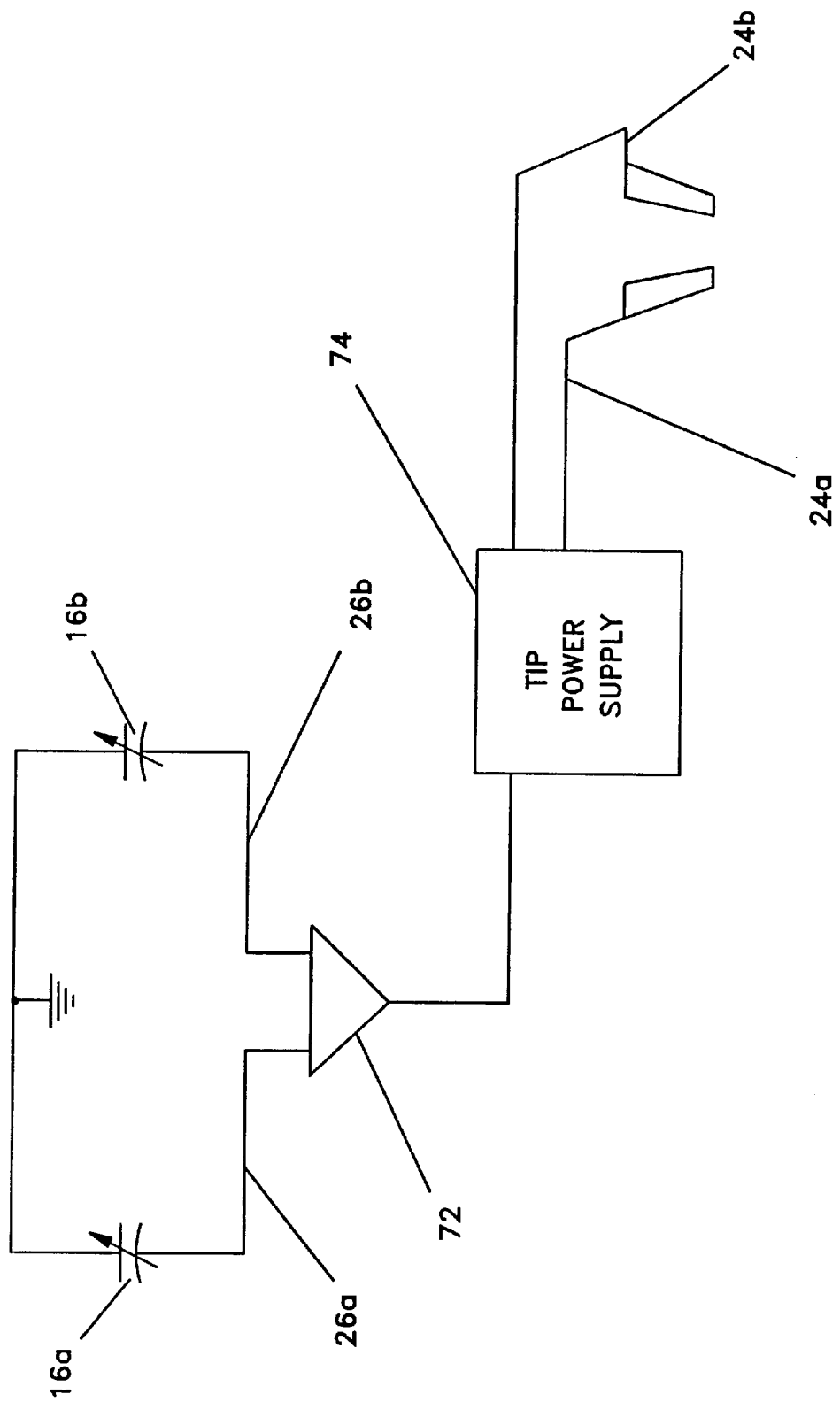

METHOD AND APPARATUS FOR ESTABLISHING A SOLDER BOND TO A SOLDER BALL GRID ARRAY

BACKGROUND OF THE INVENTION

1. Field of the Invention

The present invention relates generally to electronic circuit packaging and manufacture and, more particularly, to a method an and apparatus for electrically and mechanically connecting an electronic circuit to a card using a solder ball bonding technique.

2. Prior Art

U.S. Pat. No. 4,657,169 teaches a technique for non-contact detection of liquification of solder in a reflow soldering operation by examining the rate of change of the solder temperature or by detecting a change in a surface reflectance characteristic of the solder which occurs upon melting. Although the patent generally relates to electrical bonding of circuit elements through a soldering reflow operation, the patent does not teach or suggest the invention as taught and claimed herein.

German Patent 4000945 teaches measurement of temperature or temperature variation at soldered joints by detecting physical change such as the mechanical strength of the part changing from solid to liquid. Although the patent relates generally to soldered connections, the patent does not teach or suggest the present invention as taught and claimed herein.

U.S. Pat. No. 5,240,165 teaches a method of producing bonds of a lead to a bump on a semiconductor chip by controlling the amount of deformation of the lead in the bump during bonding. A differential amplifier is used to sense the deformation and stop the application of force to the lead in the bump when a desired amount of deformation of the lead in the bump is obtained. Although the patent teaches a method of bonding a lead to a bump on a semiconductor chip wherein deformation of the bump is sensed by a differential amplifier, the patent does not teach the improved bonding apparatus and method according to the present invention as taught and claimed herein.

U.S. Pat. No. 5,317,125 teaches a method and apparatus for monitoring the temperature of a work piece during fusing operations. The patent teaches a different measurement technique than is included in the present invention as taught and claimed herein.

U.S. Pat. No. 5,386,092 teaches a fast response weld head which employs a control system to allow user control of critical welding parameters such as speed, force, position, and duration. The patent teaches a control system using a force measurement to measure the force exerted by the electrode on the work piece to control a welding operation. The patent does not teach or suggest the present invention as taught and claimed herein wherein force is not measured.

SUMMARY OF THE INVENTION

It is an object of the present invention to control heat applied to a work piece so as to provide a reliable electrical and mechanical connection.

Accordingly, an apparatus and a method for joining two or more structures includes a bonding tool having one or more bonding tip or tips for applying heat to the site of one or more of the structures, a transducer for measuring displacement of the bonding tip or tips during the bonding operation, and a signal generator responsive to the transducer for providing a signal indicative of tip displacement. The signal generated by the signal generator may be fed back to the bonding tool to optimize bonding parameters.

It is an advantage of the present invention that bonding between a solder ball grid array and a circuit on a substrate may be effectively controlled so as to optimize bonding parameters.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

FIG. 7 is a circuit diagram illustrating a control circuit according to the present invention.

DETAILED DESCRIPTION OF A PREFERRED EMBODIMENT OF THE INVENTION

A preferred embodiment of the invention, including a method and apparatus for repeatably and reliably bonding a circuit on a substrate to a solder ball as, for example, in a spatially periodic structure, such as, a solder ball grid array, will be described with reference to the figures identified above.

It has been determined that vertical displacement of solder tips, during a partial melting of a solder ball, or other geometrically regular structure, as heat is applied, can be used as a reliable indicator of the quality of the bond. The improvement in the bond results from control of the melt volume of the solder ball. The method and apparatus according to the present invention include means for automatically controlling the application of power to the solder tips, thus controlling the partial melting of the solder ball.

Figure 1:
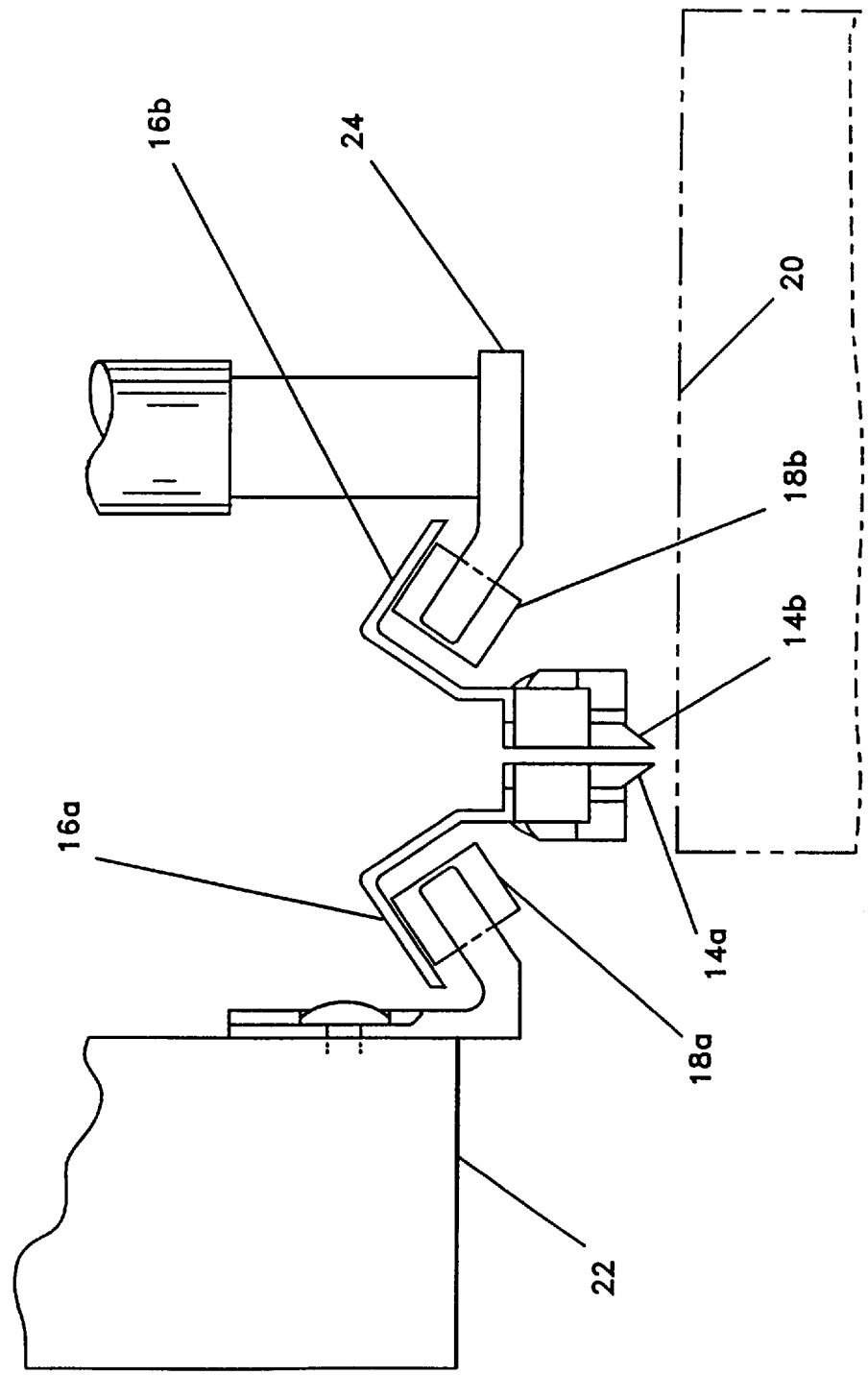
FIG. 1 is a front view of the apparatus according to the present invention.
Figure 2:
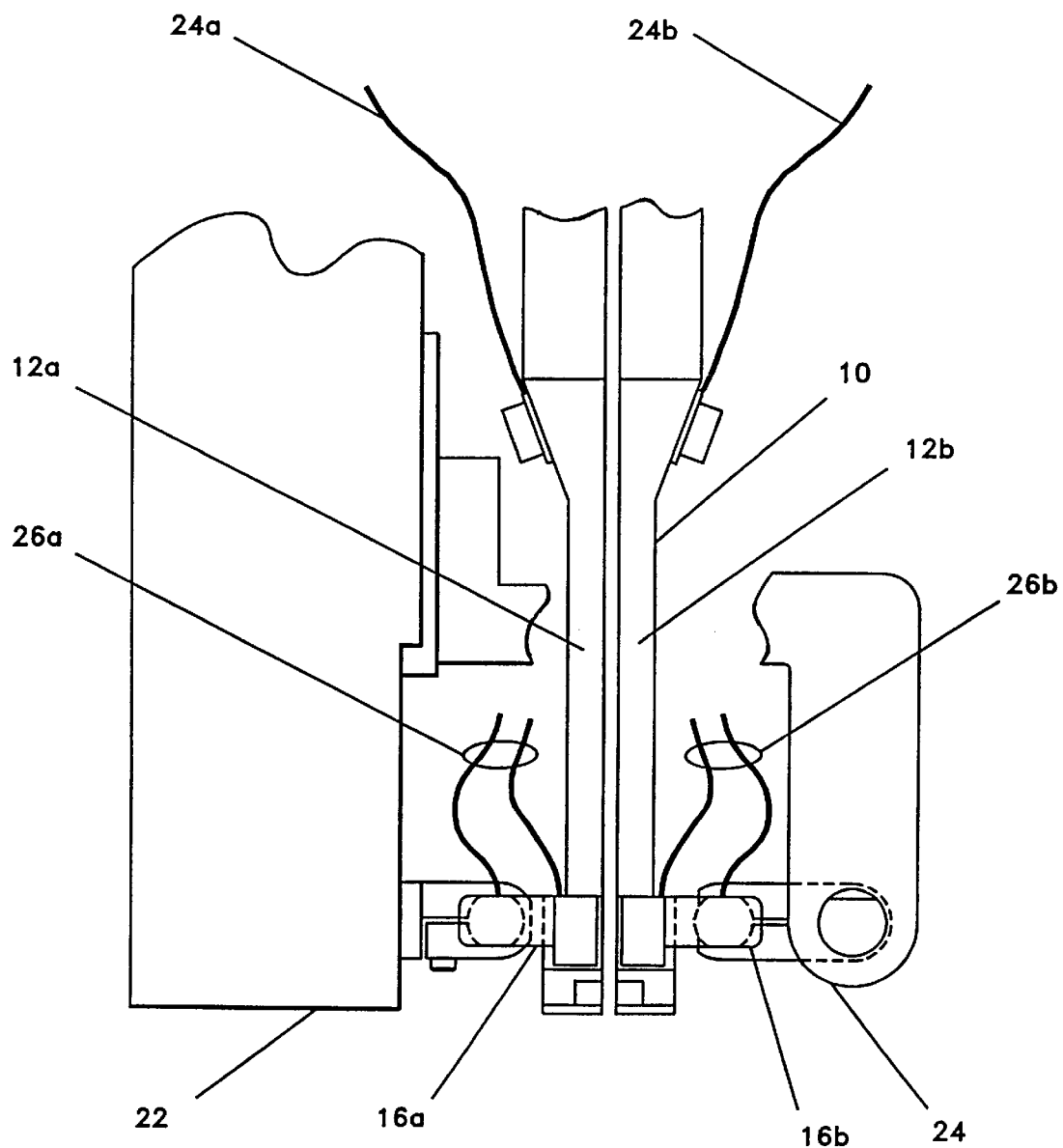
FIG. 2 is a top view of the apparatus according to the present invention.
Figure 3:
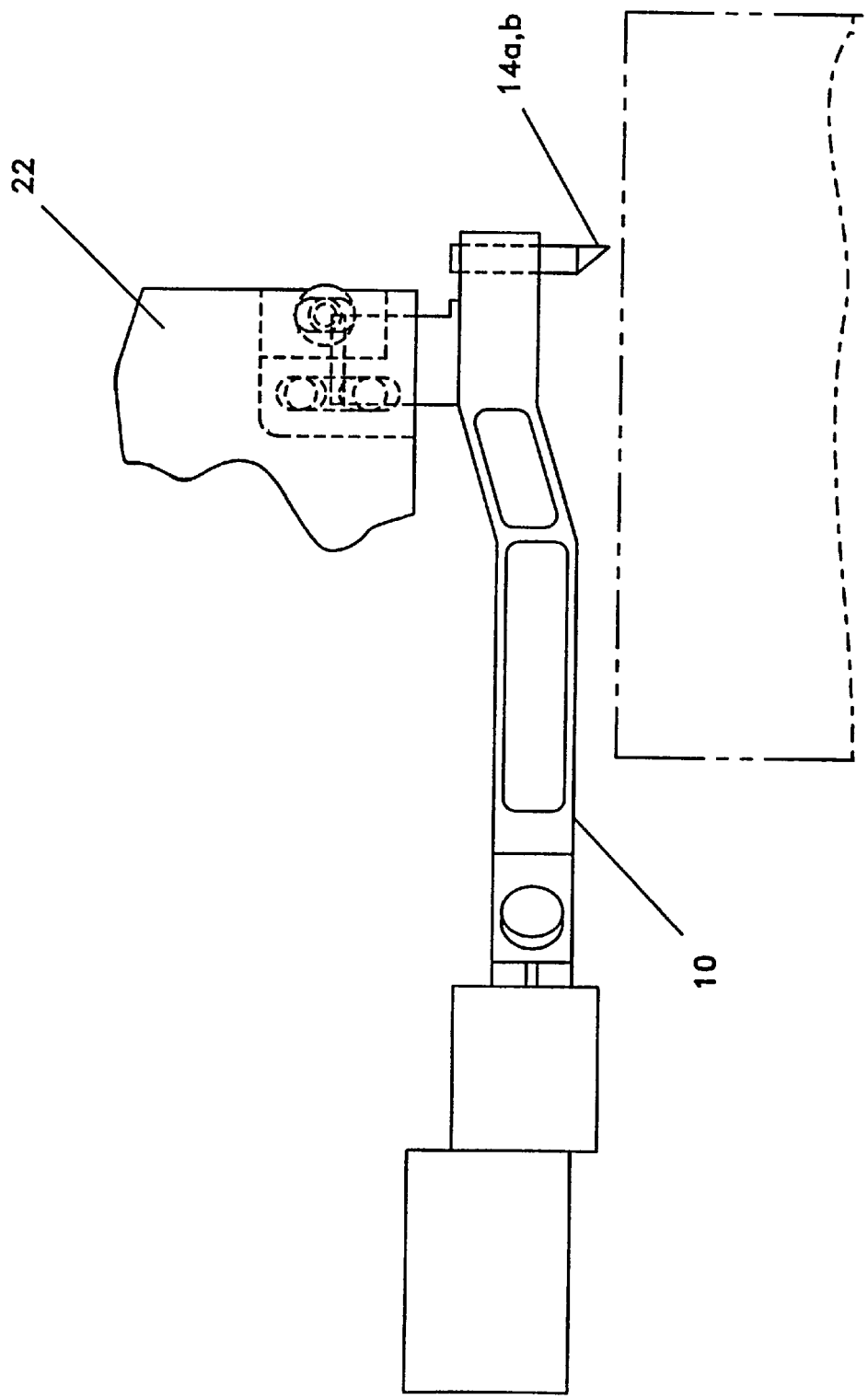
FIG. 3 is a side view of the apparatus according to the present invention.

Referring now to FIG. 1, FIG. 2, and FIG. 3, the apparatus according to the present invention will be described.

A lift arm 10 having independent flexible members 12a and 12b for independent tip motion carries solder tips 14a and 14b. Lift arm 10 is spring loaded to maintain contact between solder tips 14a,b and substrate 20, including during a melting event. A typical spring load force might be 200 grams. Solder tips 14a,b are constructed as relatively low mass tips having a high resonant frequency, to reduce tip bounce or oscillation during high speed bonding operation. The rate of partial melting of the solder ball 42 is controlled by application of power to tips 14a,b. The time of power application to tips 14a,b which controls the melting rate in solder ball 42, must be balanced with acceleration of the tips 14a,b due to the preload force to reduce undesired tip bounce. The acceleration of tips 14a,b is determined by the basic equation of mechanical motion, f/m=a. Lift arm 10 also includes flags 16a and 16b mounted on the sides of lift arm 10 near solder tips 14a and 14b for providing a measure of tip set down excursion. Tip set down excursion is the travel of the solder tips 14a, 14b toward and in contact with substrate 20. The motion of tips 14a,b is responsive to the melt front as it proceeds into solder ball 42.

A pair of displacement measurement transducers 18a and 18b are affixed to support members 22 and 24, respectively. Transducers 18a and 18b are mounted with reference to surfaces normal to the direction of movement of tips 14a,b. Transducers 18a and 18b may be implemented as capacitive transducers wherein the value of the capacitance of the transducer varies as respective flags 16a and 16b move toward or away from the surface of transducers 18a and 18b, respectively, or move in various vibrational modes, such as, torsional or vertical vibration.

Although the preferred embodiment is described with reference to capacitive transducers, other displacement measurement techniques may be employed within the scope of the invention.

Flags 16a and 16b are constructed so that a surface of each flag 16a, 16b is substantially parallel to transducers 18a, 18b as lift arm 10 moves in a vertical direction as the solder tips 14a, 14b are moved toward or away from substrate 20. Flags 16a and 16b form an approximate gull wing configuration.

The oblique angle mounting of transducers 18a and 18b and the gull wing configuration of flags 16a and 16b substantially reduce undesired capacitance change values due to torsional vibration around a major axis of lift arm 10 or bounce of lift arm 10.

Referring also to FIG. 7, capacitive displacement measurement transducers 18a and 18b are connected to a control circuit 72 by wire leads 26a and 26b, respectively. Control circuit 72 provides a control input to the solder tip power supply 74 to control the application of power to tips 14a and 14b and thus the amount of heat applied to the solder ball 42 (see FIG. 4).

Control circuit 72 stores data indicating power application and solder melting dynamics for one or more previous solder operations, and analyzes such stored data to generate the control signal for controlling power application for a current solder operation.

The current to solder tips 14a and 14b is conducted through conductive segments of lift arm 10 and wire leads 24a and 24b, respectively. As with many electrical solder or bonding systems, the electrical circuit is completed from, for example, solder tip 14a through electrical conductive material on substrate 20 where resistive heating occurs to partially melt solder ball 42.

Figure 4:
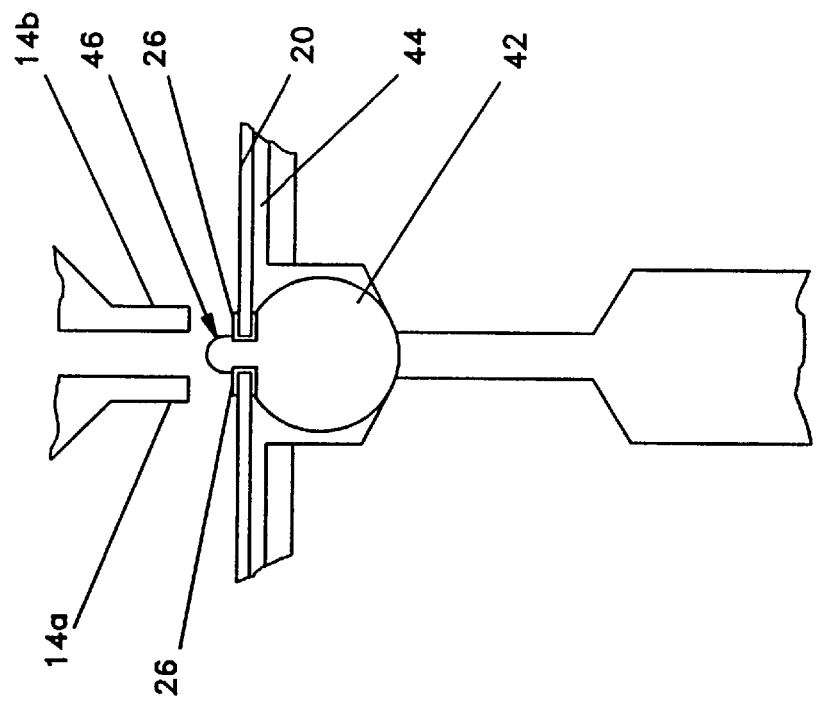
FIG. 4 is a schematic diagram of the work piece and the soldering tips before the bonding operation is performed.
Figure 5:
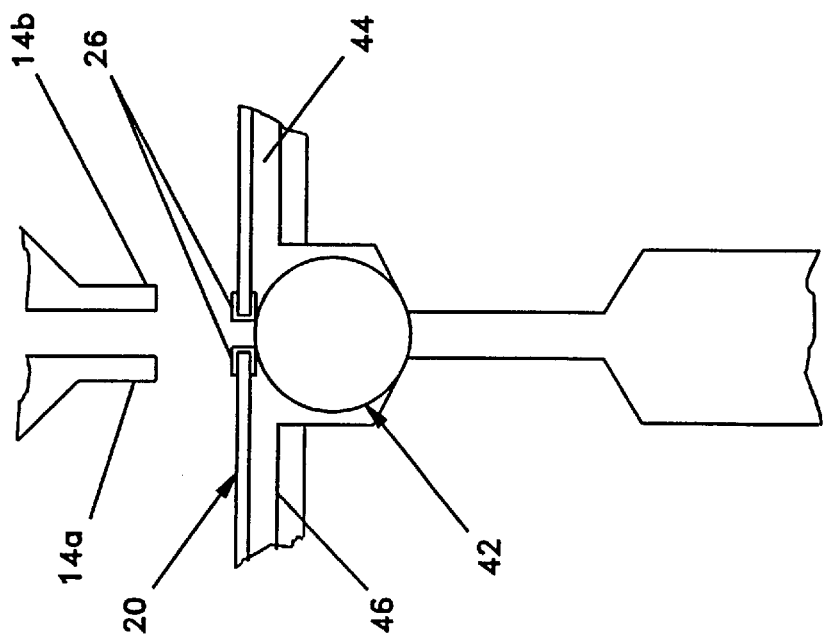
FIG. 5 is a schematic view of the work piece and the soldering tips after the bonding operation has been performed.
Figure 6:
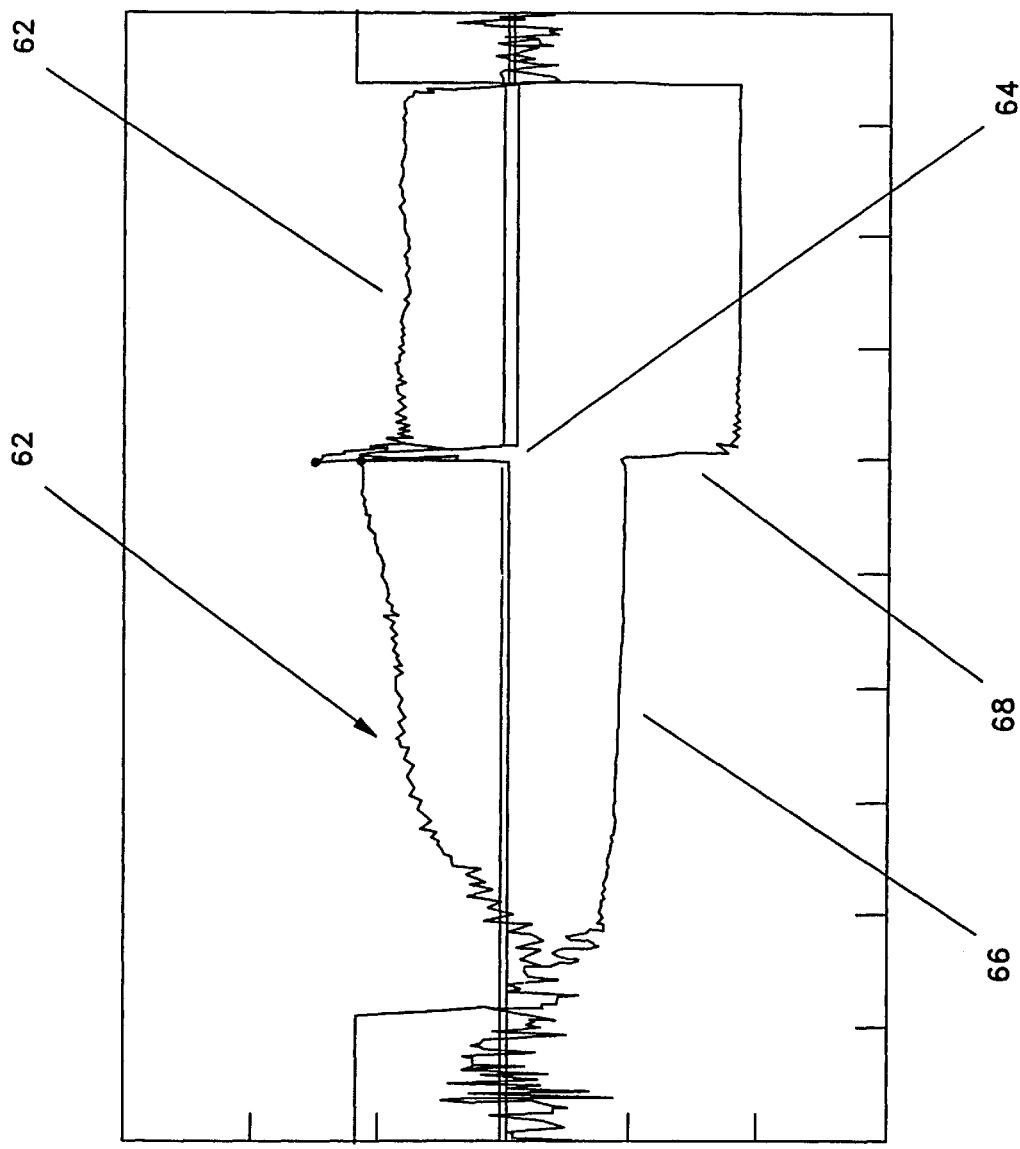
FIG. 6 is a graphical representation of force, position, and electrical impulses applied to the bonding tips in accordance with the present invention.

Referring now to FIGS. 4, 5, and 6, the solder bonding operation will be described. As solder tips 14a and 14b are moved into physical contact with substrate 20, and power is applied to the solder tips, a completed circuit is made from tip 14a through metallic conductor on tape 26 to solder ball 42 and through metallic conductor on tape 26 to solder tip 14b. This heats and melts solder ball 42 by resistance heating in the preferred embodiment of the invention. It is understood that other methods of heating and melting solder ball 42 may be employed, such as laser heating. FIG. 4 shows the condition of solder ball 42 and substrate 20 before the solder operation has occurred, and FIG. 5 shows the condition after the solder bonding has occurred.

Note the gap between substrate 20 and mask 46 before bonding in FIG. 4 which is greater than the gap 44 after bonding in FIG. 5. Gap 44 shows the vertical deformation of solder ball 42 as the solder is melted and a rivet of solder 36 is drawn through the hole in substrate 20.

It has been determined that the quality and reliability of a solder bond may be determined by the change in the geometry of solder ball 42 resulting from the partial melting of solder ball 42. Thus, the measurement of the vertical travel of tips 14a and 14b by transducers 18a and 18b may be used as a reliable control mechanism to control the application of power to the solder tips 14a and 14b to create a reliable, repeatable solder bond.

FIG. 6 illustrates, by graphical traces, the force 62 applied to solder tips 14a and 14b; the current pulse 64 applied to solder tips 14a and 14b; and a graphical representation of the tip vertical position 66 with an indication 68 of the tip "set down" as heat is applied and solder ball 42 melts, causing vertical deformation with the tip position 66 dropping as the solder ball 42 melts.

Although a preferred embodiment of the invention has been described with reference to control of application of power to tips 14a,b, it is understood by those skilled in the art that heating and melting of solder ball 42 may be controlled by controlling application of voltage or current to tips 14a,b.

Although the present invention and its advantages have been described in detail, it should be understood that various changes, substitutions and alterations can be made herein without departing from the spirit or scope of the invention as defined in the appended claims.

What is claimed is:

1. Apparatus for establishing a solder bond between a solder ball and a circuit on a substrate, comprising:

a bonding tool including one or more bonding tips for applying heat to a site where the solder ball meets the circuit on the substrate, the bonding tips defining a travel path toward and away from the substrate, and one or more flags each having a surface and approximating a gull wing configuration;

one or more transducers for measuring displacement of the bonding tips during bonding, the transducers mounted at an oblique angle relative to the travel path and substantially parallel to the surface of the flags so as to reduce undesired readings due to vibrational motion of the bonding tips; and a control system responsive to the transducers for providing a signal indicative of displacement of the bonding tips.

2. Apparatus according to claim 1 wherein the signal is indicative of the amount of solder reflowed at the site.

3. The apparatus according to claim 2 wherein the signal is fed back to the bonding tool to control bonding parameters.

4. Apparatus for controlling heat applied to a work piece, comprising:

a bonding tool including a bonding tip, for applying heat to the work piece and defining a travel path toward and away from the work piece, and a flag having a surface and approximating a gull wing configuration; and one or more transducers for measuring displacement of the bonding tip, the transducers mounted at an oblique angle relative to the travel path and substantially parallel to the surface of the flag to minimize undesired readings resulting from torsional displacement or bounce of the bonding tip;

wherein the displacement of the bonding tip is indicative of quality of bonding of the work piece.

5. Apparatus according to claim 4, further comprising feedback means responsive to the transducers for controlling the bonding tool heating parameters.

6. A method of controlling heat applied to a work piece, comprising the steps of:

provingding one or more bonding tips and one or more transducers;

arranging the transducers at an oblique angle relative to the bonding tips to minimize undesired indications by the transducers of displacement of the bonding tips based on torsion or bounce of the bonding tips;

moving the bonding tips into contact with the work piece;

measuring displacement of the bonding tips by the transducers; and controlling the application of power to the bonding tips in response to a signal generated from the transducer.

7. A method according to claim 6, wherein the controlling step further comprises the steps of:

controlling a time of application of power to the bonding tips in response to the transducer signal.

8. A method according to claim 6, wherein the controlling step further comprises the steps of:

controlling a magnitude of power applied to the bonding tips in response to the transducer signal.

9. A method according to claim 8, wherein the magnitude of the power applied to the bonding tips is controlled by a signal determined by an analysis of stored data representative of power applied in one or more previous bonding operations.

10. A method according to claim 9, wherein the magnitude and duration of the power applied to the bonding tips is controlled by a signal determined by an analysis of stored data representative of power applied and bonding characteristics of one or more previous bonding operations.

11. A method according to claim 6, further comprising the steps of:

quenching the work piece to control melting of a solder ball associated with the work piece.

12. A method according to claim 6, wherein the step of controlling application of power to the bonding comprises controlling application of an electric current to the bonding tips.

13. A method according to claim 6, wherein the step of controlling application of power to the bonding tips comprises controlling application of an electric voltage to the bonding tips.

* * * * *